United States Patent
Akino

(10) Patent No.: US 9,893,691 B2
(45) Date of Patent: Feb. 13, 2018

(54) IMPEDANCE CONVERTER AND CONDENSER MICROPHONE

(71) Applicant: Hiroshi Akino, Kanagawa (JP)

(72) Inventor: Hiroshi Akino, Kanagawa (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 0 days.

(21) Appl. No.: 15/386,174

(22) Filed: Dec. 21, 2016

(65) Prior Publication Data

US 2017/0187342 A1    Jun. 29, 2017

(30) Foreign Application Priority Data

Dec. 25, 2015    (JP) ................. 2015-253080

(51) Int. Cl.
| | |
|---|---|
| *H04R 3/06* | (2006.01) |
| *H03F 5/00* | (2006.01) |
| *H04R 19/04* | (2006.01) |
| *H04R 3/00* | (2006.01) |

(52) U.S. Cl.
CPC ............... *H03F 5/00* (2013.01); *H04R 3/00* (2013.01); *H04R 19/04* (2013.01); *H03F 2200/03* (2013.01)

(58) Field of Classification Search
CPC . H04R 1/04; H04R 3/00; H04R 3/007; H04R 3/06; H04R 19/01; H04R 19/016; H04R 19/04; H04R 2410/00; H03F 5/00; H03F 2200/03; H03F 1/00

USPC .... 381/113, 174, 26, 92, 114, 122, 355, 369
See application file for complete search history.

(56) References Cited

U.S. PATENT DOCUMENTS

| | | | |
|---|---|---|---|
| 6,453,048 B1* | 9/2002 | Akino ............... | H03F 1/30 381/113 |
| 2010/0272291 A1* | 10/2010 | Akino ............... | H04R 3/00 381/111 |
| 2010/0296670 A1* | 11/2010 | Akino ............... | H04R 3/00 381/111 |

FOREIGN PATENT DOCUMENTS

JP          4227679 B2    2/2009

* cited by examiner

*Primary Examiner* — Md S Elahee
*Assistant Examiner* — Sabrina Diaz
(74) *Attorney, Agent, or Firm* — Whitham, Curtis & Cook, P.C.

(57) ABSTRACT

In an impedance converter using an electron tube as an active element, output impedance can be made sufficiently low, and the number of circuit elements therefor is decreased and a circuit configuration therefor is made simple. Provided is an impedance converter having an electron tube cathode-follower connected. The impedance converter includes a bias diode that provides a bias voltage to a cathode of the electron tube, high resistance elements that provide a voltage of the bias diode to a grid of the electron tube, a load circuit connected to the electron tube, and a complementary emitter output circuit including two transistors, respective bases of which are connected to one end and the other end of the bias diode.

12 Claims, 3 Drawing Sheets

IMPEDANCE CONVERTER AND CONDENSER MICROPHONE

BACKGROUND

Technical Field

The present invention relates to an impedance converter and a condenser microphone using the impedance converter.

Related Art

Among impedance converters, there is one that receives an input voltage at high impedance and outputs the voltage at low impedance, like an impedance converter built in a condenser microphone, for example.

A condenser microphone has small effective capacitance, and thus needs to receive an audio signal from a microphone unit at high input impedance to secure a frequency response up to a low frequency. Further, the microphone is connected to an amplifier through a cable or the like, and thus needs low output impedance when sending an audio output signal of the condenser microphone to the amplifier. Therefore, an impedance converter that converts high input impedance into low output impedance is built in the condenser microphone.

To make characteristics of the output signal of the condenser microphone better, or to make a sound of when the output signal is reproduced more comfortable, there is a condenser microphone using an electron tube as an active element of an impedance converter. The invention described in JP 4227679 B2 is an example using electron tubes as active elements of an impedance converter, and one of embodiments thereof is illustrated in FIG. 3.

In FIG. 3, the impedance converter is mainly formed of two electron tubes 3 and 4 as the active elements. An audio signal is input from an electroacoustic transducer 11 of a condenser microphone module (hereinafter, simply referred to as "module") 1 to a grid of the electron tube 3 through a capacitor 12. Both the electron tubes 3 and 4 are triodes.

A resistor 35, a plate and cathode of the electron tube 3, a diode 57, and a plate and cathode of the electron tube 4 are connected in series between a positive electrode of a power supply, and a negative electrode, that is, a ground. When a plate current flows in the electron tubes 3 and 4, a voltage caused in the diode 57 is applied to the grid of the electron tube 3 through a diode 55 or a diode 56. The diode 55 and the diode 56 are connected in parallel such that directions into which the current flows are reverse to each other.

The plate of the electron tube 3 is connected to the negative electrode of the power supply through a capacitor 36 and a load resistor 41. A capacitor 34 is connected in parallel to the diode 57. This impedance converter has a cathode follower configuration, and the cathode of the electron tube 3 is connected to an output terminal 9.

The grid voltage of the electron tube 3, which is the grid voltage applied through the two diodes 55 and 56 connected reversely to each other in parallel, converges to a bias voltage of the electron tube 3 as a voltage between terminals of the diode 57, and no current flows in the diodes 55 and 56. Therefore, the diodes 55 and 56 are operated as high resistance elements and can make the input impedance high.

A circuit including the electron tube 4 and the load resistor 41 is operated as a constant current load of the electron tube 3. That is, a grid and the cathode of the electron tube 4 are maintained at the same potential by the load resistor 41 and the electron tube 4 allows a constant plate current to flow, and therefore the circuit including the electron tube 4 and the load resistor 41 serves as the constant current load for the electron tube 3.

SUMMARY

By use of the impedance converter described in JP 4227679 B2 for a condenser microphone, a comfortable audio signal can be obtained. However, the impedance converter described in JP 4227679 B2 has a configuration to apply a forward voltage of the diodes to the electron tube as the bias voltage, and the output impedance cannot be made sufficiently low with the configuration. When considering a use form of the microphone, an audio output of the microphone is often connected to a mixer or the like with a long microphone cord, and low output impedance is demanded. To fulfill the demand, the impedance converter described in JP 4227679 B2 needs to make the output impedance lower.

Further, the microphone has limited space in a microphone case or a housing. Therefore, desirably, the number of circuit elements added to make the output impedance lower is small, and the circuit configuration is simple.

An objective of the present invention is to make output impedance sufficiently low in an impedance converter using an electron tube as an active element, and to make the number of circuit elements small and a circuit configuration therefor simple.

Another objective of the present invention is to provide a condenser microphone using the impedance converter.

The main feature of an impedance converter according to the present invention is an impedance converter using an electron tube as an active element, and having the electron tube cathode-follower connected, including: a bias diode that provides a bias voltage to a cathode of the electron tube; a high resistance element that provides a voltage of the bias diode to a grid of the electron tube; a load circuit connected to the electron tube; and a complementary emitter output circuit including two transistors, respective bases of which are connected to one end and the other end of the bias diode.

The complementary emitter output circuit including the two transistors is connected to outputs of the electron tube that is the active element of the impedance converter, whereby a larger current can flow and the output impedance can be made sufficiently low.

DETAILED DESCRIPTION

Figure 3:
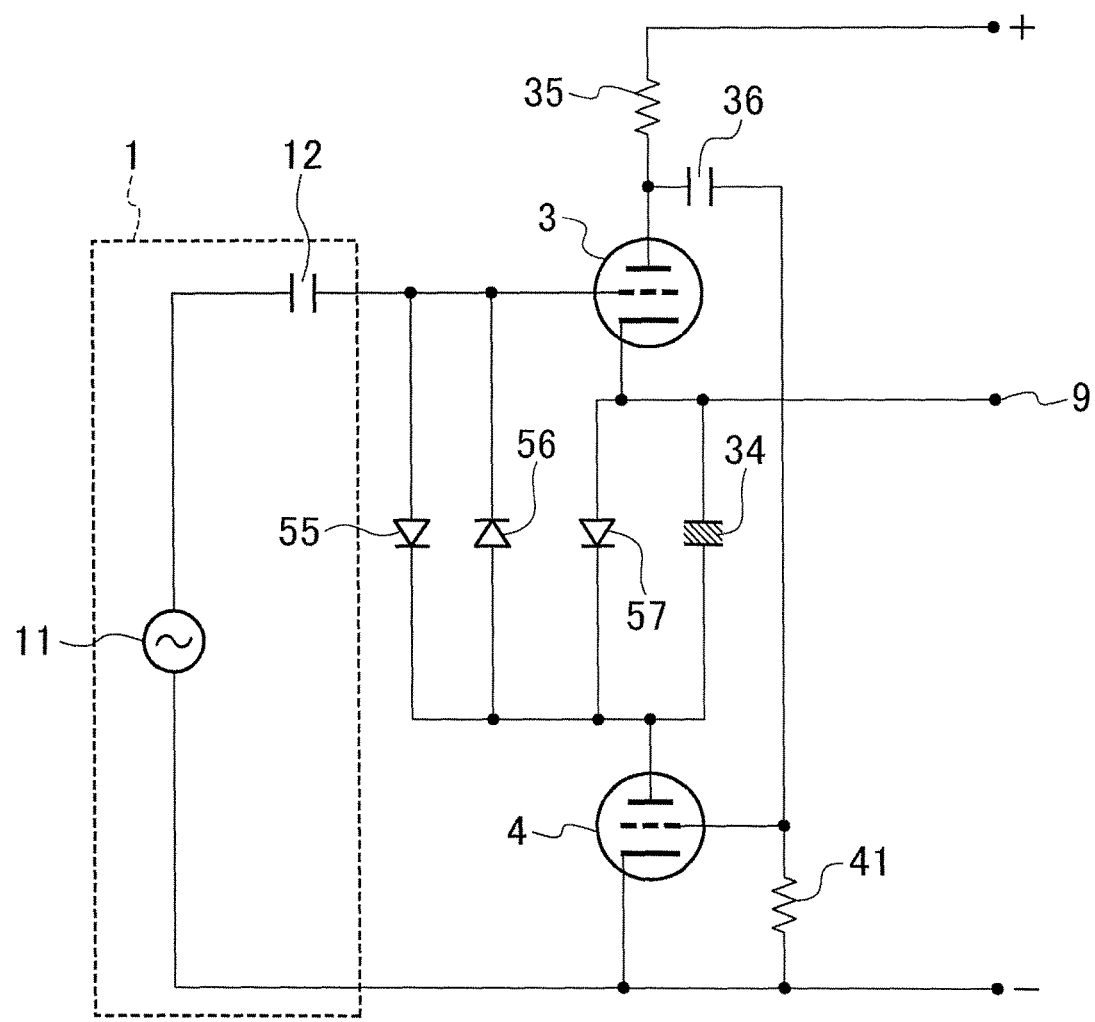
FIG. 3 is a circuit diagram illustrating an example of an impedance converter of a related technology.

Hereinafter, embodiments of an impedance converter according to the present invention will be described with reference to the drawings. The same circuit element as that of an impedance converter of a related technology illustrated in FIG. 3 is denoted with a common reference sign.

First Embodiment

Figure 1:
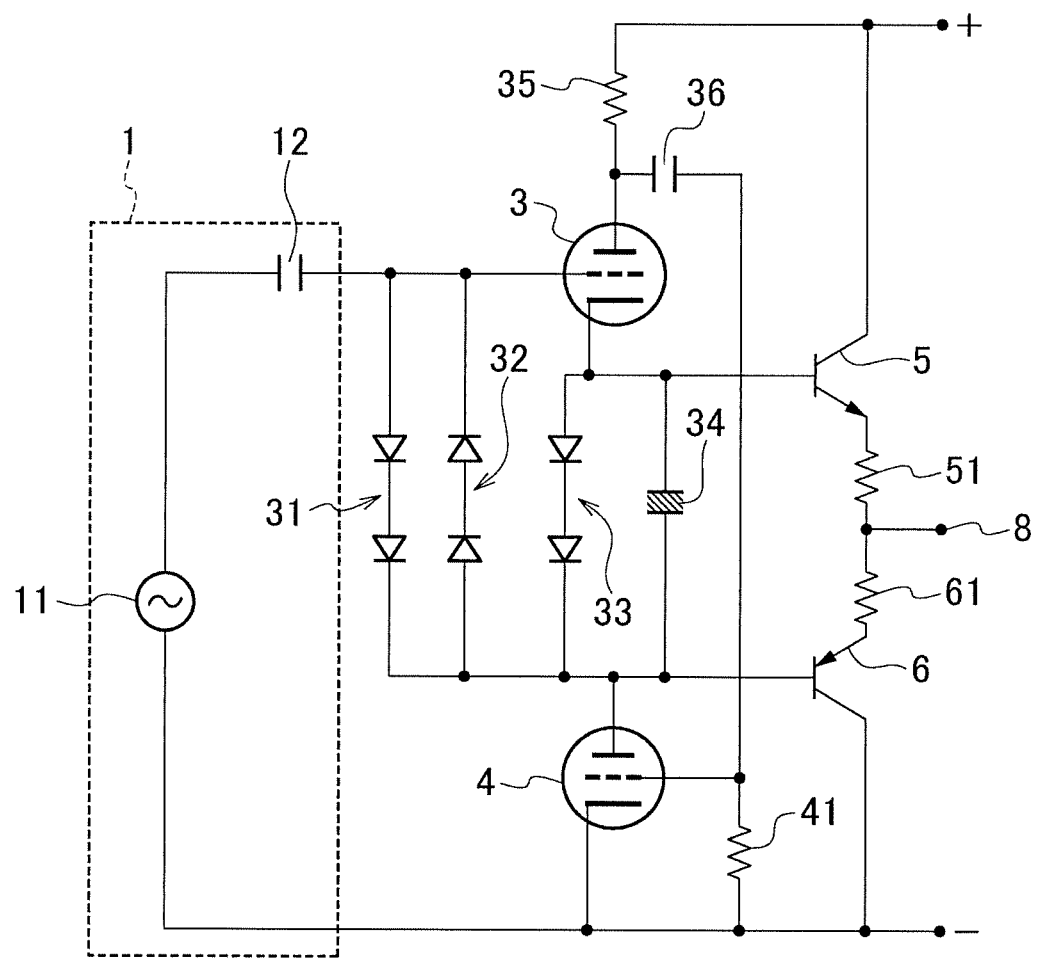
FIG. 1 is a circuit diagram illustrating an embodiment of an impedance converter according to the present invention.

In FIG. 1, a portion surrounded with the broken-line frame illustrates a condenser microphone module (hereinafter, simply referred to as "module") 1. The module 1 includes an electroacoustic transducer 11 and a capacitor 12. The electroacoustic transducer 11 includes a diaphragm which vibrates upon receiving a sound wave and a counter electrode facing the diaphragm with a fine gap, and outputs change of capacitance due to vibration of the diaphragm as an audio signal due to change of a voltage. The audio signal is input to the impedance converter using an electron tube as an active element through the capacitor 12.

The impedance converter is mainly formed of an electron tube 3 having a grid to which the audio signal is input, and a second electron tube 4 serves as a constant current load for the electron tube 3. The electron tubes 3 and 4 are triodes, and are multiple tubes in each of which two triodes are incorporated in one vacuum tube in the illustrated example. A resistor 35, a plate and cathode of the electron tube 3, a bias diode 33, and a plate and cathode of the electron tube 4 are connected in series between a positive electrode of a power supply, and a negative electrode, that is, a ground.

When a plate current flows in the electron tubes 3 and 4, a voltage is caused in the diode 33, and the voltage is provided to the cathode of the electron tube 3 as a bias voltage. The diode 33 is formed of two diodes connected in series. A forward voltage of about 0.7 V is usually caused between both ends of each of the diodes, and thus a voltage of about 1.4 V is caused in the diode 33 made of the two diodes and this voltage is provided to the cathode of the electron tube 3 as a bias voltage.

Diodes 31 and 32 are connected such that the voltage caused in the diode 33 is provided to a grid of the electron tube 3 through the diode 31 or the diode 32. Each of the diodes 31 and 32 is made of two diodes connected in series, and the diodes 31 and 32 are connected in parallel such that directions into which a current flows are reverse to each other. The diodes 31 and 32 are operated as a high resistance element to be described below.

A plate of the electron tube 3 is connected to a negative electrode of the power supply through a capacitor 36 and a load resistor 41. A capacitor 34 is connected in parallel to the diode 33. The load resistor 41 is connected between a grid and the cathode of the second electron tube 4. The second electron tube 4 and the load resistor 41 constitute a constant current circuit, and this constant current circuit constitutes a load circuit of the electron tube 3. The constant current circuit is mainly formed of the electron tube 4, whereby a voltage drop can be compensated.

This impedance converter has a cathode follower configuration, and a signal is output from the cathode of the electron tube 3. The impedance converter includes a complementary emitter output circuit. Having the output signal as an input is a characteristic of the invention of the present application. In the present embodiment, two transistors 5 and 6 that constitute the complementary emitter output circuit are included, and one end and the other end of the bias diode 33 are respectively connected to bases of the two transistors 5 and 6.

The two transistors 5 and 6 are connected in series together with emitter resistors 51 and 61 between the positive electrode of the power supply, and the negative electrode, that is, the ground. To be specific, a collector of the transistor 5 is connected to the positive electrode of the power supply, and an emitter of the transistor 5 is connected to the emitter resistor 51. The emitter resistor 51 is connected to an emitter of the transistor 6 through the emitter resistor 61 of the transistor 6, and a collector of the transistor 6 is grounded. A connection point of the two emitter resistors 51 and 61 is connected to an output terminal 8. Therefore, an output signal of the complementary emitter output circuit serves as the output signal of the impedance converter.

To normally operate the two transistors 5 and 6 that constitute the complementary emitter output circuit, usually a voltage between the base and emitter of about 0.65 V is necessary. In this embodiment, the circuit is configured such that the voltage between the base and emitter is provided from the bias diode 33 of the electron tube 3. Further, each of the two transistors 5 and 6 requires the voltage between the base and emitter of about 0.65 V, and thus the bias diode 33 is formed of a series connection of two diodes, and the bias voltage of about 1.4 V is obtained. The two transistors 5 and 6 are designed to be normally operated by being provided the bias voltage of about 1.4 V as the voltage between the base and emitter of the two transistors 5 and 6.

Corresponding to the configuration in which the bias diode 33 is formed of the two diodes, each of the diodes 31 and 32 as a high resistance element is formed of two diodes connected in series. Therefore, voltages between terminals of the diodes 31 and 32 also converge to about 1.4 V, and the current stops flowing in both of the diodes 31 and 32, and the diodes 31 and 32 function as the high resistance element. As a result, the audio signal from the module 1 is received at high input impedance.

In the above-described embodiment, the bias diode 33 of the electron tube 3 is formed of series connection of two diodes. However, the number of diodes connected in series is arbitrary, and may be one, or three or more. The point is that the number of diodes is arbitrary as long as a base and emitter voltage that can normally operate the transistors of the complementary emitter output circuit can be obtained.

According to the present embodiment, the complementary emitter output circuit is added to the impedance converter using an electron tube as an active element, whereby the output impedance can be made sufficiently low. In addition, as the voltage for operating the complementary emitter output circuit, the voltage caused in the bias diode of the electron tube 3 is used, and thus the circuit components to be added are only the two transistors 5 and 6 and the two resistors 51 and 61. Therefore, the output impedance can be made sufficiently low while the number of circuit elements is small and the circuit configuration is simple.

Second Embodiment

The diodes 31 and 32 in the above-described embodiment function as the high resistance element. Therefore, a pure resistor 38 with a high value such as 1 MΩ may be connected between a grid of an electron tube 3 and a plate of a second electron tube 4, like an embodiment illustrated in FIG. 2, in place of the diodes 31 and 32 in the above-described embodiment. Other circuit configurations are the same as those of the embodiment.

[Condenser Microphone]

Figure 2:
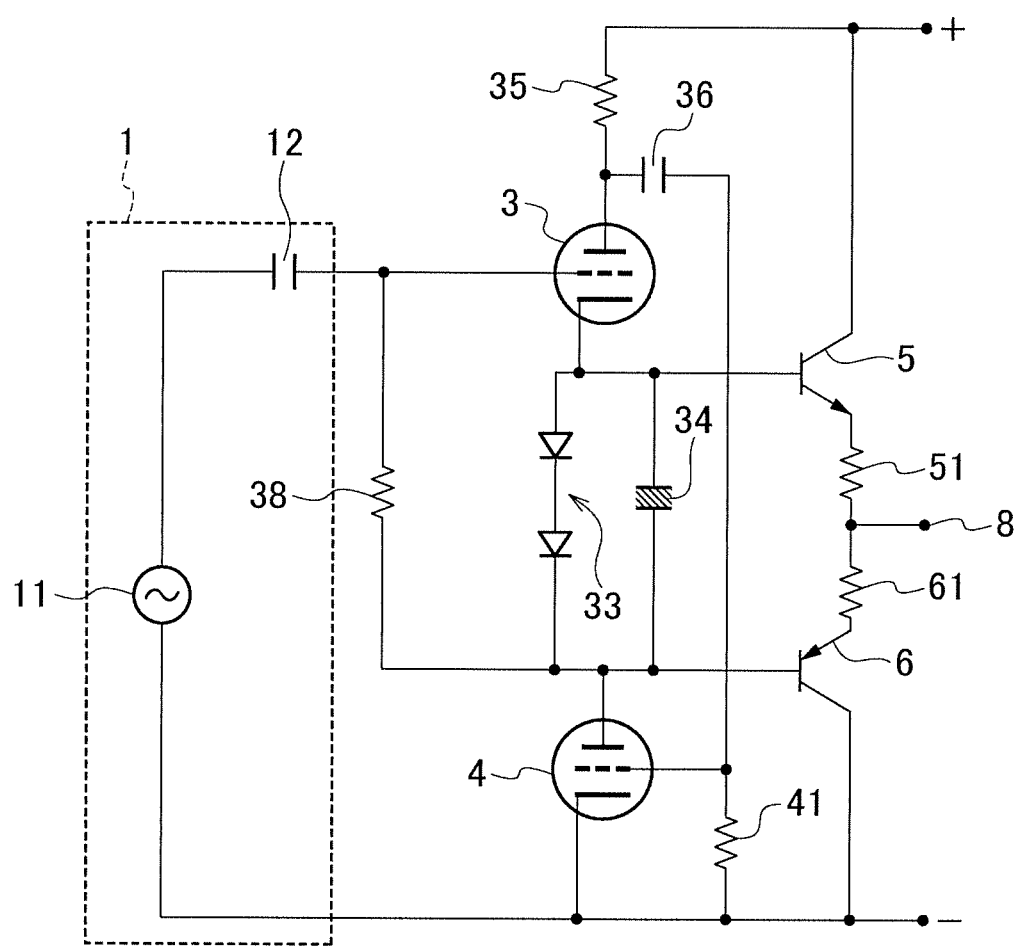
FIG. 2 is a circuit diagram illustrating another embodiment of an impedance converter according to the present invention.

The embodiments illustrated in FIGS. 1 and 2 are examples in which the impedance converter using an electron tube as an active element is applied to the condenser microphone. In the embodiments illustrated in FIGS. 1 and 2, the audio signal electroacoustically transduced in the module 1 is input to the grid of the electron tube 3 of the impedance converter and the impedance is converted into low impedance, and the audio signal is output from the output terminal 8. The impedance of the output signal is converted into sufficiently low impedance, and thus even if an audio signal is transmitted through a long cord, a decrease in characteristics of the audio signal can be made small.

What is claimed is:

1. An impedance converter using an electron tube as an active element, and having the electron tube cathode-follower connected, the impedance converter comprising:

a bias diode that provides a bias voltage to a cathode of the electron tube;

a high resistance element that provides a voltage of the bias diode to a grid of the electron tube;

a load circuit connected to the electron tube; and a complementary emitter output circuit including two transistors, respective bases of which are connected to one end and an other end of the bias diode.

2. The impedance converter according to claim 1, further comprising:

emitter resistors respectively connected to the two transistors, wherein an output terminal is connected to a common connection point of the emitter resistors.

3. The impedance converter according to claim 1, wherein the high resistance element is second and third diodes connected reversely to each other in parallel.

4. The impedance converter according to claim 1, wherein the bias diode is made of a plurality of diodes connected in series.

5. The impedance converter according to claim 3, wherein each of the second and third diodes is made of a plurality of diodes connected in series.

6. The impedance converter according to claim 1, wherein the load circuit is a constant current load circuit including a second electron tube and a load resistor.

7. The impedance converter according to claim 1, wherein the high resistance element is made of a pure resistor.

8. The impedance converter according to claim 1, wherein the bias diode is formed of series connection of two diodes that provides a voltage between a base and an emitter of the two transistors, wherein the two transistors are designed to be normally operated by being provided the bias voltage between the base and the emitter of the two transistors.

9. The impedance converter according to claim 8, wherein the high resistance element is second and third diodes connected reversely to each other in parallel, and each of the second and third diodes is two diodes connected in series, wherein voltages between terminals of the second and third diodes converge to about the bias voltage, wherein a current stops flowing in both of the second and third diodes, and wherein the second and third diodes function as the high resistance element.

10. The impedance converter of claim 1, wherein the impedance converter is configured to reduce impedance with a minimal number of circuit elements required to reduce impedance.

11. A condenser microphone that converts an audio signal at high impedance output from a condenser microphone module into an audio signal at low impedance and outputs the audio signal by an impedance converter, the impedance converter being an impedance converter using an electron tube as an active element, and having the electron tube cathode-follower connected, the impedance converter including:

a bias diode that provides a bias voltage to a cathode of the electron tube;

a high resistance element that provides a voltage of the bias diode to a grid of the electron tube;

a load circuit connected to the electron tube; and a complementary emitter output circuit including two transistors, respective bases of which are connected to one end and an other end of the bias diode.

12. The condenser microphone of claim 11, wherein the impedance converter is configured to reduce impedance with a minimal number of circuit elements required to reduce impedance.

* * * * *